United States Patent [19]
Matsuda et al.

[11] 4,150,311
[45] Apr. 17, 1979

[54] DIFFERENTIAL AMPLIFIER CIRCUIT

[75] Inventors: Zensuke Matsuda; Shigeru Koshimaru, both of Tokyo, Japan

[73] Assignee: Nippon Electric Co., Ltd., Tokyo, Japan

[21] Appl. No.: 841,289

[22] Filed: Oct. 12, 1977

[30] Foreign Application Priority Data

Oct. 15, 1976 [JP] Japan .................. 51-123668

[51] Int. Cl.² .................. H03K 5/20; G11C 7/06; H03K 3/353; H03K 3/286
[52] U.S. Cl. .................. 307/355; 307/200 B; 307/279; 307/DIG. 3; 365/204; 365/205
[58] Field of Search ......... 307/355, 362, 279, DIG. 3, 307/238, 205, 202, 200 B; 365/207, 208

[56] References Cited

U.S. PATENT DOCUMENTS

| | | | |
|---|---|---|---|
| 3,838,295 | 9/1974 | Lindell | 307/DIG. 3 X |
| 3,882,326 | 5/1975 | Kruggel | 307/DIG. 3 X |
| 3,959,781 | 5/1976 | Mehta et al. | 307/DIG. 3 X |
| 3,976,895 | 8/1976 | Koo | 307/DIG. 3 X |
| 4,007,381 | 2/1977 | Mohsen | 307/DIG. 3 X |
| 4,028,558 | 6/1977 | Heller et al. | 307/DIG. 3 X |
| 4,031,522 | 6/1977 | Reed et al. | 307/DIG. 3 X |
| 4,039,861 | 8/1977 | Heller et al. | 307/DIG. 3 X |
| 4,054,865 | 10/1977 | Shirato | 307/DIG. 3 X |
| 4,070,590 | 1/1978 | Ieda et al. | 307/DIG. 3 X |
| 4,081,701 | 3/1978 | White, Jr. et al. | 307/355 |

FOREIGN PATENT DOCUMENTS 2361823  6/1975  Fed. Rep. of Germany .... 307/DIG. 3

OTHER PUBLICATIONS

Chu et al., "Low-Power, High-Speed Sense Latch", IBM Tech. Discl. Bull.; vol. 17, No. 9, pp. 2582-2583, 2/1975.
Rock, "Threshold Compensated Fet Latch Circuit", IBM Tech. Discl. Bull.; vol. 18, No. 11, pp. 3593-3594, 4/1976.
Barsuhn et al., "Semiconductor Storage Circuit Utilizing Two Device Memory Cells", IBM Tech. Discl. Bull.; vol. 18, No. 3, pp. 786-787, 8/1975.

Primary Examiner—Larry N. Anagnos
Attorney, Agent, or Firm—John M. Calimafde

[57]  ABSTRACT

A differential type amplifier circuit for use as a sensing amplifier in a memory circuit having a first stage amplifier and a second stage differential type amplifier. The first stage amplifier includes a pair of amplification circuits, the inputs of which are selectively clamped to a predetermined potential. The first stage amplifier functions to amplify low level differential input signals and these amplified signals are applied to the second stage amplifier, the amplified level of the input signals being sufficient to operate the second stage amplifier irrespective of changes in the threshold voltage of the second stage amplifier. Selectively clamping the inputs of the first stage amplifier to a predetermined potential allows the first stage amplifier to accurately amplify the low level input signals due to the fact that the threshold voltage of the first stage amplifier cannot vary from the predetermined potential. Therefore the entire differential sensing amplifier operates free of any changes in amplifier threshold voltage.

13 Claims, 5 Drawing Figures

DIFFERENTIAL AMPLIFIER CIRCUIT

BACKGROUND OF INVENTION

This invention relates to a differential amplifier circuit, and more particularly to a differential signal amplifying circuit which is utilized as a sense amplifier for a memory circuit.

Recently, MOS one transistor memory cells have been used widely as this type of memory cell has a minimum number of active elements, thus allowing the construction of small memory cells.

As shown in FIG. 1, this type of memory cell consists of a storage capacitor Co and a transistor Qo having a gate electrode, a source electrode and a drain electrode. The gate electrode is electrically connected to a row select line 10, the source electrode is electrically connected to a column-select line 20 and the drain electrode is electrically connected to the capacitor Co.

In a one transistor memory cell, information read-out is dependent on that charge or lack of charge stored in capacitor Qo. Due to the fact that the charge stored in capacitor Qo is very small it is extremely difficult to detect the information stored in the memory cell. Therefore, a MOS differential signal amplifier is commonly used as a sense amplifier for detecting the stored information. Such a differential signal amplifier is essentially constructed from a balanced flip-flop circuit wherein the same electrical potential is initially impressed on both input terminals of the flip-flop circuit and thereafter the information to be read out from the memory cell is impressed on one of the input terminals. The potential of the read out information impressed on the one of the input terminals, causes an imbalance in the flip-flop which tips the flip-flop in a predictable direction to produce an output signal.

Therefore what occurs is that the differential input signal is amplified due to the amplifying function of the flip-flop circuit to produce a complementary output at the two input/output terminals. In such a differential amplifier, a relatively high voltage is necessarily impressed on the gate electrode of one of the MOS transistors included in the flip-flop subsequent to the amplifying operation. The result is that an electric field is applied to the gate insulating film of the MOS transistor for a considerable period of time causing a polarization of a phosphorous glass layer placed on the gate insulating film and/or causing a drift of cations in the gate insulating film which changes the value of the threshold voltage of the MOS transistor. This change in the threshold voltage is undesirable for any amplifier and especially for a differential amplifier utilized to amplify the above-described small input signals because it lowers the reliability and sensitivity of the amplifier. These types of prior art devices are disclosed in "Electronics" magazine, dated Sept. 13, 1973, on pages 113 to 121.

With reference to FIGS. 2 and 3, the differential type sense amplifier circuit according to the prior art will be described. As shown in FIG. 2, n channel field effect transistors $Q_1$, $Q_2$, $Q_3$ and $Q_4$ comprise a flip-flop circuit, in which transistors $Q_1$ and $Q_2$ are provided with a constant voltage $V_{DD}$ at their drain electrodes and are used as load transistors in accordance with clock signal SE. Similarly transistors $Q_3$ and $Q_4$ are used as amplifying transistors.

N channel field effect transistors $Q_5$, $Q_7$ and $Q_8$ are used to charge input terminals 1 and 2, and to charge node 3 of the flip-flop circuit with a constant voltage source $V_M$ by controlling the potential of the gate electrodes of transitions $Q_5$, $Q_7$ and $Q_8$ with signal P before clock signal SE is impressed on the gate electrode of n channel field effect transistor $Q_6$. Transistor $Q_6$ controls an operation of the flip-flop circuit as will be described hereinafter. N channel field effect transistor $Q_9$ inserted between input terminals 1 and 2 is used to equalize the potential between terminals 1 and 2 in accordance with the signal P.

Refer to FIG. 3 wherein it is illustrated that in the operation of this amplifier, the signal P is maintained at a high level till time $T_1$ thereby allowing terminals 1 and 2 and node 3 to be charged. Thereafter chip-enable signal CE goes high and is impressed on a relevant memory cell (not shown) for activation thereof and information read from the memory cell is impressed on the terminals 1 and 2 as a differential signal input. At time $T_2$, the clock signal SE goes high and is impressed on the gate electrodes of the transistors $Q_1$, $Q_2$ and $Q_6$ to activate the flip-flop circuit for amplifying the differential signal input. Thus, the amplified output of the read-out information can be detected at the terminals 1 and 2. Finally, at time $T_3$, the levels of the chip-enable signal CE and clock signal SE change to a low level and the level of the signal P again becomes high to complete the sensing operation.

However, after the amplified output is developed, a relatively high voltage is still impressed on the gate electrode of one of the transistors $Q_3$ and $Q_4$ during the relatively long period of time between $T_2$ and $T_3$, which is the period that the clock signal SE is at a high level. This causes a polarization of a phosphorous glass layer in the gate oxide film included in the transistor which results in a change in the threshold voltage of the transistor. Thus the sensitivity and reliability of this amplifier is adversely affected.

It is therefore an object of this invention to prevent changes in the threshold voltage of a differential signal amplifier.

It is another object of this invention to increase the sensitivity of a differential signal amplifier.

It is a further object of this invention to provide a sensitive sense amplifier for a memory circuit which is resistant to changes in threshold voltage.

SUMMARY OF INVENTION

A differential type amplifier according to this invention comprises a first stage amplifier comprising two amplifying means, a second stage differential type amplifier, and means for clamping input terminals of the amplifying means of the first stage amplifier to a predetermined potential that does not affect the performance of the two amplifying means. The first stage amplifier is initially enabled and low level differential input signals are applied to the input terminals of the two amplifying means, whereby the first stage amplifier produces amplified differential signals, the level of which is sufficient to operate the second stage amplifier. In this manner the amplified differential signals from the first stage amplifier are further amplified and maintained by the second stage amplifier. Subsequent thereto, the potential of the input terminals of the two amplifying means is clamped to the predetermined potential. A high voltage is impressed on the second stage amplifier so that the threshold voltage thereof may be varied. However, in the first stage amplifier, which is receiving low level input signals, the threshold voltage thereof is not varied, so that a differential signal may be amplified accurately.

Accordingly, even if the threshold voltage is varied in the second stage amplifier, the differential input signal is amplified such that it is free of the influence of variations in the threshold voltage of the second stage amplifier thereby solving the problems previously experienced with prior art amplifying circuits.

The present invention is applicable to, and effective with various kinds of field-effect transistors.

The foregoing and other objects and features of this invention will be more fully understood from the following description of an illustrative embodiment thereof taken in conjunction with the accompanying drawings.

DESCRIPTION OF PREFERRED EMBODIMENT

Figure 1:
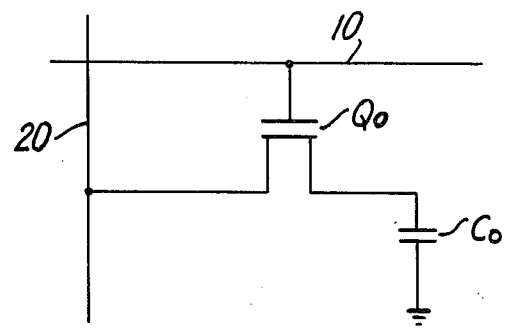
FIG. 1 is a circuit diagram showing a transistor memory cell.
Figure 2:
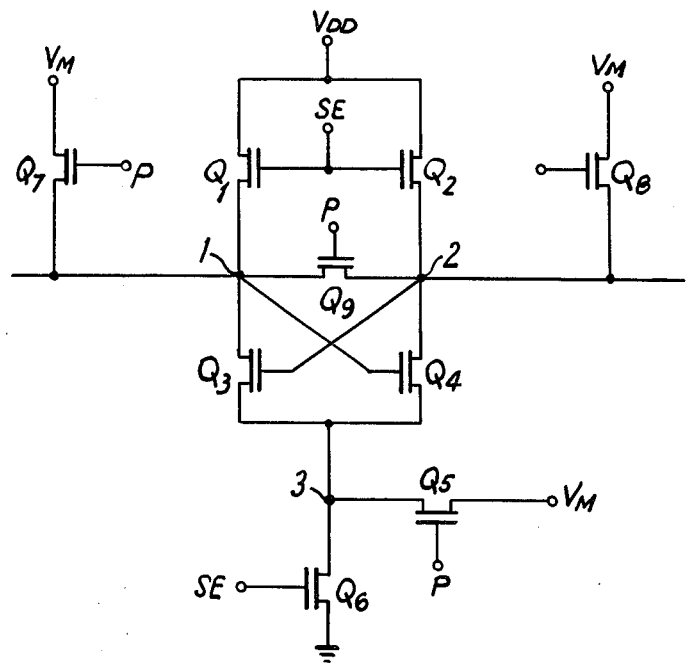
FIG. 2 is a circuit diagram showing a prior art differential type sense amplifier.
Figure 3:
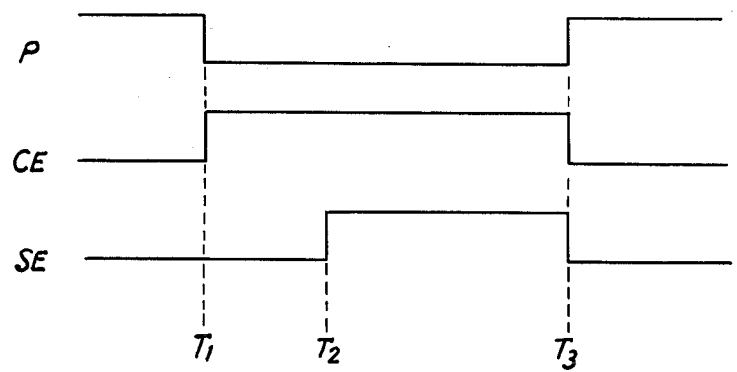
FIG. 3 is a diagram showing the wave forms of respective signals for operating the circuit of FIG. 2.
Figure 4:
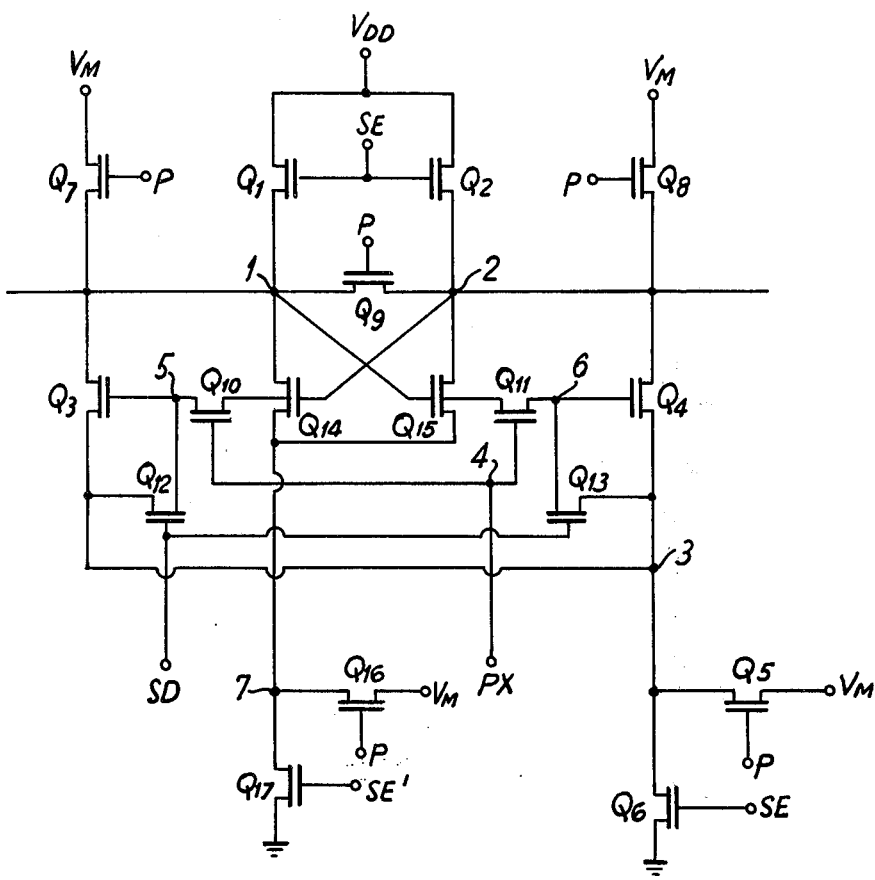
FIG. 4 is a circuit diagram of one embodiment of the invention.
Figure 5:
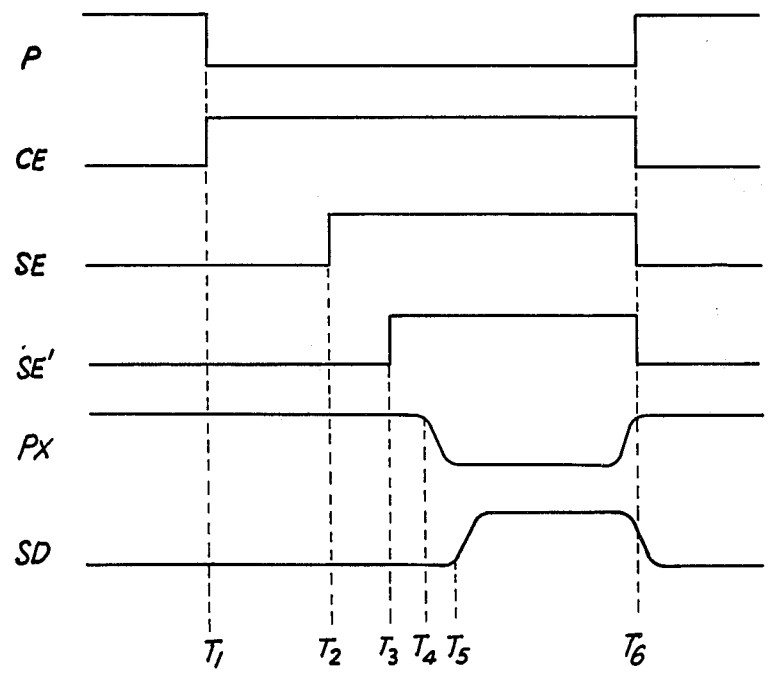
FIG. 5 is a diagram showing the wave forms of respective signals for operating the circuit of FIG. 4.

Now, with reference to FIGS. 4 to 5, an embodiment according to this invention will be described. In this embodiment, all transistors $Q_1$ to $Q_{17}$ are assumed to be n-channel enhancement type MOS transistors. A first stage flip-flop amplifier includes transistors $Q_1$, $Q_2$, $Q_3$ and $Q_4$. Transistors $Q_{10}$ and $Q_{11}$ are used for operatively applying a differential signal input to the first stage amplifier. Drain electrodes and gate electrodes of the transistors $Q_1$ and $Q_2$ are commonly connected to a constant voltage source $V_{DD}$ and to a clock signal SE, respectively. A source electrode of $Q_1$ and a drain electrode of transistor $Q_3$ are connected at a node 1, to which is also connected a source or drain electrode of transistor $Q_{11}$, the remaining drain or source electrode of $Q_{11}$ being electrically connected to a gate electrode of transistor $Q_4$. A source electrode of $Q_2$ and a drain electrode of transistor $Q_4$ is connected at a node 2 to which is also connected a source or drain electrode of transistor $Q_{10}$, the remaining drain or source electrode of which is electrically connected to a gate electrode of transistor $Q_3$. Source electrodes of transistors $Q_3$ and $Q_4$ are connected in common at a node 3 and also coupled to a drain electrode of transistor $Q_6$. The gate and source electrodes of $Q_6$ are connected to a clock signal SE and to the ground potential, respectively. Gate electrodes of the transistors $Q_{10}$ and $Q_{11}$ are connected in common and supplied with a timing signal PX.

A second stage differential amplifier includes transistor $Q_1$, $Q_2$, $Q_{14}$, $Q_{15}$ and $Q_{17}$, in which transistors $Q_1$ and $Q_2$ are used as load transistors in common with the first stage flip-flop amplifier. The source electrode of the transistor $Q_1$ is connected at the node 1 to a drain electrode of the transistor $Q_{14}$ and to a gate electrode of the transistor $Q_{15}$. The source electrode of $Q_2$ is connected at the node 2 to a drain electrode of the transistor $Q_{15}$ and to a gate electrode of the transistor $Q_{14}$. Source electrodes of the transistors $Q_{14}$ and $Q_{15}$ are connected in common and coupled to a drain electrode of the transistor $Q_{17}$ at a node 7. Gate and source electrodes of $Q_{17}$ are connected to a timing signal SE' and to the ground potential, respectively.

Other transistors $Q_7$, $Q_8$, $Q_5$ and $Q_{16}$ are used for charging the nodes 1, 2, 3, and 7 respectively before the amplifying operation. Drain electrodes and gate electrodes of these transistors $Q_7$, $Q_8$, $Q_5$ and $Q_{16}$ are connected to voltage source $V_M$ and to a signal source P, respectively. Source electrodes of these transistors $Q_7$, $Q_8$, $Q_5$ and $Q_{16}$ are connected to nodes 1, 2, 3 and 7, respectively.

Transistor $Q_9$ is inserted between the nodes 1 and 2 for equalizing the potential at nodes 1 and 2 in response to the signal P. Transistors $Q_{12}$ and $Q_{13}$ are provided between the gate electrodes and the source electrodes of the transistors $Q_3$ and $Q_4$, respectively for short-circuiting gates and sources of $Q_3$ and $Q_4$ in response to the timing signal SD impressed on the gate electrodes of $Q_{12}$ and $Q_{13}$ to thereby clamp the gate electrodes of $Q_3$ and $Q_4$ to the ground potential. The nodes 1 and 2 serve as both input and output terminals of the circuit.

A description of this amplifier will now be given with reference to FIG. 5. At a time $T_1$ when the nodes 1, 2, 3 and 7 have been charged by voltage $V_M$ via $Q_7$, $Q_8$, $Q_5$ and $Q_{16}$ in conjunction with the signal P, the signal P is changed to a low level. At this same time, the chip-enable signal CE is raised to a high level, and a differential signal such as information read-out from a memory cell (not shown) is applied to the nodes 1, 2. At time $T_2$ the timing signal SE is raised to a high level and the signal PX is also high to activate the first stage flip-flop amplifier consisting of transistors $Q_3$ and $Q_4$. This results in amplifying the input signal to a value which is large when compared with an unbalanced value of threshold voltages existing between transistors $Q_{14}$ and $Q_{15}$ in the second stage flip-flop amplifier, the unbalanced value being developed due to the polarization occurring in the gate portions of $Q_{14}$ and $Q_{15}$. At this time the gate electrodes of the transistors $Q_3$ and $Q_4$ are electrically connected to the nodes 2 and 1 respectively, since the transistors $Q_{10}$ and $Q_{11}$ are maintained "ON" by the signal PX which is at a high level. At this same time, the transistors $Q_{14}$ and $Q_{15}$ of the second stage flip-flop amplifier are not enabled, since the level of signal SE' is low.

At time $T_3$, the timing signal SE' is raised to a high level to enable the second stage flip-flop amplifier. Thereafter at time $T_4$, the signal PX goes low to turn the transistors $Q_{10}$ and $Q_{11}$ "OFF". The signal SD is immediately raised to a high level to turn the transistors $Q_{12}$ and $Q_{13}$ "ON" at time $T_5$, thereby connecting the gate electrodes of the transistors $Q_3$ and $Q_4$ to the ground potential by way of enable transistor $Q_6$.

Thus, after amplifying the differential input signal to a level free from the influence of the above-described polarization in the second stage flip-flop amplifier, the first stage flip-flop amplifier transfers its amplified differential signal to the second stage flip-flop amplifier, while at the same time any change in threshold voltages of the transistors $Q_3$ and $Q_4$ is prevented by clamping the gate electrode potentials of the transistors $Q_3$ and $Q_4$ to the ground potential. The input differential signal for the second stage flip-flop amplifier is amplified by the first stage flip-flop amplifier to such a level that the second stage flip-flop amplifier can operate irrespective of any change in the threshold voltages present in $Q_{14}$ and $Q_{15}$. The output signal of the circuit which, has been amplified by the second stage amplifier is derived from the nodes 1 and 2.

At time $T_6$, the levels of the signals SD, SE', SE and chip-enable signal CE go low and at the same time the levels of the signals P and PX go high. This completes the operation of this sense amplifier.

In the operation of the circuit, the duration between time $T_3$ and time $T_5$ are not critical. More particularly, the changes in the level of the signals SE', PX and SD may occur at the same time during the interval between times $T_3$ to $T_5$. Other types of field-effect transistors can also be used in this invention and the described usages of source and drain electrodes for the transistors are not restricted in the above embodiment.

Although a specific embodiment of this invention has been shown and described, it will be understood that various modifications may be made without departing from the spirit of this invention.

We claim:

1. A differential amplifier circuit comprising a pair of cross-coupled field-effect transistors having two nodes, a pair of amplifying means having respective input and output terminals, each of said output terminals being connected to each of said two nodes, a pair of switching means, said switching means having an on state and an off state, each one of said switching means being coupled to one of said input terminals of said amplifying means, input means coupled to said switching means for applying a pair of differential input signals to said input terminals of said amplifying means via said switching means when said switching means are in the ON state, and means for discharging electric charge from said input terminals of said amplifying means when said switching means are in the OFF state.

2. A differential amplifier circuit according to claim 1, in which said input means are connected to said nodes and one of said switching means is connected between the input terminals of one of said amplifying means and the node to which the output terminal of the other amplifying means is connected, and the other switching means is connected between the input terminal of the other amplifying means and the other node, amplified output signals being derived from said nodes.

3. A differential signal amplifier circuit comprising a first flip-flop circuit including first and second field-effect transistors each field-effect transistor having a gate, source and drain electrode, the gate electrode of said first transistor and one of the source, drain electrodes of said second transistor being connected to a first node, a gate electrode of said second transistor and one of the source, drain electrodes of said first transistor being connected to a second node, third and fourth field-effect transistors each having a gate, source and drain electrode, one of the source, drain electrodes of said third transistor being connected to said first node, one of the source, drain electrodes of said fourth transistor being connected to said second node, first means for operatively connecting the gate electrode of said third transistor to said second node, second means for operatively connecting the gate electrode of said fourth transistor to said first node, and third means for operatively discharging electric charge from the gate electrodes of said third and fourth transistors.

4. A differential amplifier circuit according to claim 3 further comprising means for precharging said first and second nodes to a substantially equal potential.

5. A differential amplifier circuit according to claim 3, in which said first and second means are operative during a first period of time and said third means are operative during a second and subsequent period of time.

6. A differential amplifier circuit according to claim 3, in which input signals are applied to said first and second nodes and output signals are derived from said first and second nodes.

7. A differential signal amplifier circuit according to claim 6, further comprising fourth means for selectively enabling said first flip-flop circuit and fifth means for selectively enabling said third and fourth transistors.

8. A differential amplifier circuit according to claim 3, in which the other of said source, drain electrodes of said third transistor and the other of said source, drain electrodes of said fourth transistor are connected in common at a third node.

9. The circuit according to claim 8, in which said third means includes fifth and sixth field-effect transistors respectively connected between said third node and the gate electrodes of said third and fourth transistors.

10. A signal amplifier circuit comprising first and second field-effect transistors cross-coupled at first and second nodes, third and fourth field-effect transistors each having a source, drain and gate, one of said source and drain of said third field-effect transistor being coupled to said first node and the other of said source and drain being coupled to a common node, one of said source and drain of said fourth field-effect transistor being coupled to said second node and the other of said source and drain being coupled to said common node, a fifth field-effect transistor coupled between the gate of said third field-effect transistor and said second node, a sixth field-effect transistor coupled between the gate of said fourth field-effect transistor and said first node, means for commonly applying a first control signal to the gates of said fifth and sixth field-effect transistors, a seventh field-effect transistor coupled between the gate of said third field-effect transistor and said common node, an eighth field-effect transistor coupled between the gate of said fourth transistor and said common node, and means for commonly applying a second control signal to the gates of said seventh and eighth field-effect transistors, wherein said second control signal renders said seventh and eighth transistors conductive at, the time said first control signal renders said fifth and sixth transistors non-conductive.

11. A signal amplifier circuit comprising a flip-flop circuit including first and second field-effect transistors cross-coupled at first and second nodes and having a first common node, third and fourth field-effect transistors, one of a source and drain of said third field-effect transistor having an electrical connection to said first node, one of a source and drain of said fourth field-effect transistor having an electrical connection to said second node, the other of said source and drain of said third and fourth field-effect transistors being commonly connected to a second common node, fifth and sixth field-effect transistors respectively connected between a gate of said third field-effect transistor and said second node and between a gate of said fourth field-effect transistor and said first node, gates of said fifth and sixth field-effect transistors being commonly supplied with a first control signal, and seventh and eighth field-effect transistors arranged respectively to selectively connect the gates of said third and fourth field-effect transistors to said second common node, and gates of said seventh and eighth field-effect transistors being commonly supplied with a second control signal.

12. The circuit of claim 11, further comprising a ninth field-effect transistor arranged to operatively connect said first common node to a voltage source, a tenth field-effect transistor arranged to operatively connect second common node to a voltage source, and means for precharging said first and second nodes to a substantially equal voltage potential.

13. The circuit of claim 11, in which said first control signal renders said fifth and sixth field-effect transistors conductive during a first period of time and said second control signal renders said seventh and eighth field-effect transistors conductive in order to discharge electric charge from the gates of said third and fourth field-effect transistors during a second period of time, said second period of time being substantially subsequent to said first period of time.

* * * * *